(12) United States Patent
Wang

(10) Patent No.: US 12,262,505 B2
(45) Date of Patent: Mar. 25, 2025

(54) ADDITIVE MANUFACTURING SYSTEM FOR THREE-DIMENSIONAL PRINTING

(71) Applicant: AGENCY FOR SCIENCE, TECHNOLOGY AND RESEARCH, Singapore (SG)

(72) Inventor: Fuke Wang, Singapore (SG)

(73) Assignee: AGENCY FOR SCIENCE, TECHNOLOGY AND RESEARCH, Singapore (SG)

(*) Notice: Subject to any disclaimer, the term of this patent is extended or adjusted under 35 U.S.C. 154(b) by 268 days.

(21) Appl. No.: 17/912,543

(22) PCT Filed: Mar. 22, 2021

(86) PCT No.: PCT/SG2021/050154
§ 371 (c)(1),
(2) Date: Sep. 19, 2022

(87) PCT Pub. No.: WO2021/188057
PCT Pub. Date: Sep. 23, 2021

(65) Prior Publication Data
US 2023/0147886 A1    May 11, 2023

(30) Foreign Application Priority Data
Mar. 20, 2020    (SG) ............................ 10202002620P

(51) Int. Cl.
*H05K 7/20* (2006.01)
*B29C 64/277* (2017.01)
(Continued)

(52) U.S. Cl.
CPC ....... *H05K 7/20209* (2013.01); *B29C 64/277* (2017.08); *B29C 64/393* (2017.08); *B33Y 30/00* (2014.12); *B29C 64/124* (2017.08)

(58) Field of Classification Search
CPC ........ G02B 6/4266–4269; B29C 33/02; B29C 33/04; B29C 64/124; B29C 64/277;
(Continued)

(56) References Cited

U.S. PATENT DOCUMENTS 4,729,076 A * 3/1988 Masami ................ F21V 29/763
361/717
6,621,239 B1 * 9/2003 Belliveau ............. H05B 47/155
315/316
(Continued)

FOREIGN PATENT DOCUMENTS

CN    208164309 U    11/2018
CN    110253886 A     9/2019
(Continued)

OTHER PUBLICATIONS

Search Report and Written Opinion in International Application No. PCT/SG2021/050154 dated Jun. 23, 2021, 9 pages.
(Continued)

*Primary Examiner* — Amir A Jalali
(74) *Attorney, Agent, or Firm* — MARSHALL, GERSTEIN & BORUN LLP

(57) ABSTRACT

There is provided a lighting system comprising a light source, and a cooling system with temperature sensing and responding capability coupled to the light source for maintaining a temperature of the light source within a defined variation from a set temperature. There are also provided a method of adjusting a temperature of a light source and a method of assembling the lighting system. There is further provided an additive manufacturing system for three-dimensional printing comprising the lighting system.

18 Claims, 7 Drawing Sheets

(51) Int. Cl.
*B29C 64/393* (2017.01)
*B33Y 30/00* (2015.01)
*B29C 64/124* (2017.01)

(58) Field of Classification Search
CPC .............. B29C 64/393; H05K 7/20; H05K 7/20136–20209; H05K 7/20254; H05K 7/20172; H05K 7/2019; H05K 7/20718; H05K 5/0213; H01L 23/34; H01L 23/367; H01L 23/3675; H01L 23/467; B33Y 10/00; B33Y 30/00; B33Y 40/20; B33Y 80/00
See application file for complete search history.

(56) References Cited

U.S. PATENT DOCUMENTS

| | | | | |
|---|---|---|---|---|
| 11,460,185 | B1* | 10/2022 | Braysy et al. | H05K 1/189 |
| 2007/0124574 | A1* | 5/2007 | Goldberg | G06F 1/206 |
| | | | | 713/100 |
| 2009/0126905 | A1* | 5/2009 | Dinh | F21K 9/00 |
| | | | | 165/104.33 |
| 2010/0207534 | A1* | 8/2010 | Dowling | H05B 45/3725 |
| | | | | 313/46 |
| 2010/0244648 | A1* | 9/2010 | Yoo | F21K 9/232 |
| | | | | 313/46 |
| 2011/0025211 | A1* | 2/2011 | Bae | F21V 29/54 |
| | | | | 313/46 |
| 2017/0271843 | A1* | 9/2017 | Batchelder | B29C 64/135 |
| 2018/0036941 | A1 | 2/2018 | Xu et al. | |
| 2019/0191592 | A1* | 6/2019 | Liu | F04D 27/004 |
| 2020/0130269 | A1* | 4/2020 | Beyer | B29C 64/106 |
| 2021/0153383 | A1* | 5/2021 | Dailey | H05K 7/20172 |

FOREIGN PATENT DOCUMENTS

| | | |
|---|---|---|
| CN | 209616351 U | 11/2019 |
| WO | WO-2019/022766 A1 | 1/2019 |

OTHER PUBLICATIONS

Written Opinion in SG Application No. 11202253278K dated Feb. 9, 2024, 11 pages.

* cited by examiner

ADDITIVE MANUFACTURING SYSTEM FOR THREE-DIMENSIONAL PRINTING

CROSS-REFERENCE TO RELATED APPLICATIONS

This application claims the benefit of priority of Singapore patent application No. 10202002620P, filed on 20 Mar. 2020, its contents being hereby incorporated by reference in its entirety.

TECHNICAL FIELD

The present disclosure relates to an additive manufacturing system, in particular, to an additive manufacturing system for three-dimensional printing.

BACKGROUND ART

Three-dimensional (3D) printing, officially defined as "additive manufacturing" by American Society for Testing and Materials (ASTM), describes a range of technologies that digitally fabricate three dimensional objects on an additive layer-by-layer basis. There are various available printing technologies in the market, and the most widely adopted additive manufacturing technologies include fused deposition modelling (FDM), stereolithography (SLA), selective laser sintering (SLS), selective laser melting (SLM), and digital light processing (DLP). New additive manufacturing processes continue to be developed and commercialized. While three-dimensional printing initially used polymers for prototyping, a much wider variety of polymers, metal alloys, composites and ceramics have been developed for applications in digital manufacturing.

In the past few years, the market of 3D printers experienced a large fluctuation. Desktop 3D printers as additive manufacturing systems experienced an exponential rise in sales throughout the past decade, from an estimated 66 systems sold in 2007, to an astounding 528.952 systems in 2017. From the end of 2017, the professional printer segment in 3D printing market emerged and has steadily risen in use and popularity. This is mainly from the request for real product manufacturing and high engineering performance. Furthermore, fast printing is urgently needed to save time and cost for product manufacturing.

Both SLA and DLP technologies use a vat of photopolymer or resin to build a final object from a digital file. In SLA, the laser beam "writes" the image onto the vat of resin, line by line and layer by layer to form the final object. Thus, SLA is a time-consuming strategy. Compared to SLA technologies, the advantage of both DLP and LCD based printing is the build speed. As an entire layer is flashed at once, instead of a single point, the two technologies are typically able to produce parts faster. However, the high prices and limited building size of the parts limit the DLP based printer applications.

LCD-display based 3D printers use an array of UV LCDs as a light source. The light from the flat LCD panels shines directly, in a parallel fashion, onto the build area. As this light isn't expanded, pixel distortion is less of an issue with LCD printing. Therefore, the LCD process seems to be a better choice for fast and large sized printing. However, most LCD based printers suffer from low light intensities and thus require longer curing time for each slicing layer. The attempts to increase light intensity of the lighting source often lead to unstable performance due to heat accumulation for high power lighting sources.

Accordingly, there is a need to provide a lighting system and an additive manufacturing system for three-dimensional printing which are able to overcome or at least ameliorate the disadvantages discussed above.

SUMMARY

In one aspect, there is provided a lighting system comprising a light source, and
a cooling system with temperature sensing and responding capability coupled to the light source for maintaining a temperature of the light source within a defined variation from a set temperature.

Advantageously, the cooling system may be used to stabilize the temperature of the light source in a self-feedback manner. The cooling system may sense and respond to the temperature change of the light source to maintain the temperature of the light source at around a substantially stable temperature or a set temperature with some allowable deviation from the set temperature.

Further advantageously, the lighting source can operate at a high power range without leading to an unstable performance due to the heat accumulation of the high light intensity of the light source.

In another aspect, there is provided a method of adjusting a temperature of a light source comprising the steps of
 a) sensing the temperature of the light source, and
 b) adjusting the operation of a cooling means of a cooling system with temperature sensing and responding capability coupled to the light source in response to a temperature change of the light source, whereby the temperature change is a temperature difference between the temperature sensed in step (a) and a set temperature of the light source.

The method of adjusting the temperature of the light source may be regarded as a method of cooling the light source, whereby the temperature of the light source is decreased by increasing the operation of the cooling means when the temperature of the light source is above the set temperature, resulting in a temperature change between the temperature sensed in step (a), and the set temperature. Therefore, the cooling means is operated when the temperature of the light source in step (a) is above the set temperature of the light source by more than a pre-determined variation (which can be a discrete value or a percentage value). The sensing step (a) can also be regarded as a measuring step (a) in which the temperature of the light source is measured.

In another aspect, there is provided a method of assembling the lighting system as defined herein, comprising the steps of
 a) attaching a light source to a heat sink with a thermally conductive adhesive, and
 b) coupling a cooling system with temperature sensing and responding capability to the light source, the heat sink, or the thermally conductive adhesive.

In another aspect, there is provided an additive manufacturing system for three-dimensional printing comprising a lighting system as defined herein.

Advantageously, the additive manufacturing system may operate with a high light intensity of the lighting system to reduce the curing time of each slicing layer during three-dimensional printing, and therefore achieve a fast printing speed.

Further advantageously, the additive manufacturing system may achieve a steady printing performance with high resolution due to the cooling system with temperature sensing and responding capability. This solves the problem of unstable performance due to heat accumulation for high power lighting sources. Articles with fine and complicated structures can be printed with the additive manufacturing system as described herein.

Yet further advantageously, structure arrangement has been optimized to minimize the size of the additive manufacturing system. Space optimization ensures an additive manufacturing system that is tightly packed but with good heat dissipation. Interface optimization between the motion control system and display system ensures high-speed printing. Due to the high efficiency and stability of the lighting system, the printing speed of the present disclosure may be 2 to 3 times faster than the commercial additive manufacturing systems.

Definitions

The term "additive manufacturing" as used herein represents use of computer-aided-design (CAD) software or 3D object scanners to direct hardware for depositing material, layer by layer, in three-dimensional precise geometric shapes. The additive manufacturing adds material to create an object, in contrast with the process for which material is removed to create an objection.

The term "coupled" as used herein represents that the component may be directly or indirectly linked together or in contact with each other. For example, two components may be linked together directly or through a third component.

The term "connected" as used herein represents that the component are directly linked together or in contact with each other. For example, two electrical components may be linked together directly via a conducting electrical cable.

Unless specified otherwise, the terms "comprising" and "comprise", and grammatical variants thereof, are intended to represent "open" or "inclusive" language such that they include recited elements but also permit inclusion of additional, unrecited elements.

The terms "a" and "an" herein do not denote a limitation of quantity, but rather denote the presence of at least one of the referenced items.

As used herein, the term "about", in the context of concentrations of components of the formulations, typically means+/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Certain embodiments may also be described broadly and generically herein. Each of the narrower species and sub-generic groupings falling within the generic disclosure also form part of the disclosure. This includes the generic description of the embodiments with a proviso or negative limitation removing any subject matter from the genus, regardless of whether or not the excised material is specifically recited herein.

DETAILED DESCRIPTION

Exemplary, non-limiting embodiments of a lighting system will now be disclosed

The present disclosure relates to a lighting system comprising a light source, and a cooling system with temperature sensing and responding capability coupled to the light source for maintaining a temperature of the light source within a defined variation from a set temperature.

The cooling system with temperature sensing and responding capability may be connected to the light source for maintaining the temperature of the light source within the defined variation from the set temperature.

Advantageously, the cooling system may be used to stabilize the temperature of the light source in a self-feedback manner. The cooling system is able to detect temperature variation of the light source and is programed to respond to the temperature variation for adjusting the temperature of the light source back to the set temperature, in order to achieve the self-feedback effect.

The light source may be an electroluminescence light source. Non-limiting examples of such electroluminescence light source may be light emitting diodes, organic light-emitting diodes, field-induced polymer electroluminescent, or lasers. The light source may be a light emitting diode (LED) array.

A power rating of the light source may be in the range of about 30 watt to about 200 watt, about 40 watt to about 200 watt, about 50 watt to about 200 watt, about 60 watt to about 200 watt, about 70 watt to about 200 watt, about 80 watt to about 200 watt, about 90 watt to about 200 watt, about 100 watt to about 200 watt, about 120 watt to about 200 watt, about 140 watt to about 200 watt, about 160 watt to about 200 watt, about 180 watt to about 200 watt, about 30 watt to about 180 watt, about 30 watt to about 160 watt, about 30 watt to about 140 watt, about 30 watt to about 120 watt, about 30 watt to about 100 watt, about 30 watt to about 90 watt, about 30 watt to about 80 watt, about 30 watt to about 70 watt, about 30 watt to about 60 watt, about 30 watt to about 50 watt, about 30 watt to about 40 watt, about 50 watt to about 100 watt, or about 80 watt to about 100 watt. The power rating of the light source may be about 50 watt. The power rating of the light source may be about 100 watt.

The lighting system may further comprise a heat sink coupled to the light source. The heat sink may be connected to the light source of the lighting system. The heat sink may help to dissipate the heat generated from the light source. The heat sink may have pins that extend from its base to maximize the surface area. The pins can be cylindrical, elliptical or square. The heat sink may be made from a thermally conductive metal. The material of the thermally conductive metal is not particularly limited and non-limiting examples may be aluminium, copper, or their alloys.

The lighting system may further comprise a thermally conductive adhesive which fills a gap, if present, between the light source and the heat sink. This gap between the light source and the heat sink may be an air gap and therefore, the thermally conductive adhesive may ensure that the heat conducting and efficiency of heat dissipation of the heat sink are not affected by the heat insulating property of the air present in the air gap.

Advantageously, the cooling system may sense and respond to the temperature change of the light source to maintain a substantially stable temperature of the light source or maintain the temperature of the light source around a set value. The stable temperature or set temperature may fluctuate around the stable temperature or set temperature by a temperature variation in the range of about ±1.5° C., about ±1.6° C., about ±1.7° C., about ±1.8° C., about ±1.9° C. or about ±2.0° C. This can be done by using the cooling system to ensure that the temperature of the light source does not deviate above the allowable variation.

The cooling system may be regarded as an integrated cooling system. The integrated cooling system may be regarded as one having the cooling means, the temperature sensing means and the responding capability means as one integrated unit, or at least able to be assembled into an integrated unit.

Further advantageously, the lighting source can operate with a high power range without leading to an unstable performance due to the heat accumulation of the high light intensity of the light source.

The cooling system may comprise:
a temperature sensor;
a controlling board configured to generate a command signal responsive to the temperature sensor; and
a cooling means configured to cool the light source in response to the command signal.

The temperature sensor may be coupled to the light source. The temperature sensor may be electrically coupled to the light source. The temperature sensor may be connected to the light source. Alternatively, where the lighting system further comprises the heat sink, the temperature sensor may be disposed on the heat sink and the temperature sensor detects the temperature of the heat sink.

The controlling board may be an electronic controlling board that is capable of receiving an electronic signal (such as a voltage signal) from the temperature sensor and produces the command signal (such as a voltage signal) to control the operation of the cooling means. The controlling board may be a programmable controlling board. The programmable controlling board may be a programmed Arduino controlling board.

The controlling board may comprise an electronic switch (such as a transistor). The command signal may comprise a voltage signal. A signal transmitter (such as a signal pin) may be configured to communicate electronically with the electronic switch to generate the voltage signal.

The command signal may be generated by a G-mode command according to a circuit description. The electronic switch then activates or stops the flow of a current through the cooling means to thereby activate or stop the operation of the cooling means.

The signal transmitter and/or the electronic switch may be part of the controlling board or may be separate from the controlling board but in electronic communication with the controlling board.

In operation, the cooling means may be set at an increased cooling rate in order to cool down the light source until the temperature of the light source reaches the set temperature. At this point, the temperature sensor and controlling board cause the cooling means to operate at a default cooling rate or stop operation. The cooling means may be an electronic fan or other heat dissipation devices.

The default cooling rate may be in the range about 50 rpm to about 200 rpm, about 50 rpm to about 150 rpm, about 50 rpm to about 100 rpm, about 50 rpm to about 80 rpm, about 50 rpm to about 70 rpm, about 70 rpm to about 200 rpm, about 80 rpm to about 200 rpm, about 100 rpm to about 200 rpm or about 150 rpm to about 200 rpm. The increased cooling rate is thus any value above the default cooling rate.

Exemplary, non-limiting embodiments of a method of adjusting a temperature of a light source will now be disclosed The present disclosure relates to a method of adjusting a temperature of a light source comprising the steps of
a) sensing the temperature of the light source, and
b) adjusting the operation of a cooling means of a cooling system with temperature sensing and responding capability coupled to the light source in response to a temperature change of the light source, whereby the temperature change is a temperature difference between the temperature sensed in step (a) and a set temperature of the light source.

The cooling system may comprise:
a temperature sensor;
a controlling board configured to generate a command signal responsive to the temperature sensor; and
the cooling means configured to cool the light source in response to the command signal.

The method of adjusting the temperature of the light source may be a method of cooling the light source.

The set temperature may be in the range of about 20° C. to about 40° C., about 25° C. to about 40° C., about 30° C. to about 40° C., about 35° C. to about 40° C., about 20° C. to about 35° C., about 20° C. to about 30° C., about 20° C. to about 25° C., or about 25° C. to about 27° C. The set temperature may be about 25° C.

Step b) may comprise the step of b1) operating the cooling means at a default cooling rate when the light source is turned on.

The default cooling rate may be in the range about 50 rpm to about 200 rpm, about 50 rpm to about 150 rpm, about 50 rpm to about 100 rpm, about 50 rpm to about 80 rpm, about 50 rpm to about 70 rpm, about 70 rpm to about 200 rpm, about 80 rpm to about 200 rpm, about 100 rpm to about 200 rpm or about 150 rpm to about 200 rpm.

Step b) may further comprise the step of b2) increasing the operation of the cooling means by a defined percentage for each degree Celsius temperature increase of the light source above the set temperature.

The defined percentage may be in the range of about 5% to about 30%, about 10% to about 30%, about 15% to about 30%, about 20% to about 30%, about 25% to about 30%, about 5% to about 25%, about 5% to about 20%, about 5% to about 15%, or about 5% to about 10%. The defined percentage may be 10%. As an example, where the cooling means is an electronic fan with a cooling rate as mentioned above, increasing the operation of the cooling means by the defined percentage for each degree Celsius temperature increase means increasing the (base) cooling rate of the electronic fan by the defined percentage such that the cooling rate of the electronic fan is increased.

Step b) may further comprise the step of operating the cooling means at the default cooling rate or stopping the cooling means if the temperature of the light source is lower than the set temperature.

The cooling means may be an electronic fan.

Exemplary, non-limiting embodiments of a method of assembling the lighting system as defined herein will now be disclosed The present disclosure relates to a method of assembling the lighting system as defined herein, comprising the steps of
attaching a light source to a heat sink with a thermally conductive adhesive, and
coupling a cooling system with temperature sensing and responding capability to the light source, the heat sink, or the thermally conductive adhesive.

The cooling system may be coupled to the light source, the heat sink, or the thermally conductive adhesive via a temperature sensor. The cooling system may be connected to the light source, the heat sink, or the thermally conductive adhesive via a temperature sensor. The temperature sensor may be coupled to the light source. The temperature sensor may be electrically coupled to the light source. The temperature sensor may be connected to the light source. Alternatively, the light source and the temperature sensor may be disposed on the heat sink and the temperature sensor detects the temperature of the heat sink.

The temperature sensor may be further coupled to a controlling board. The temperature sensor may be electrically connected to a controlling board. The controlling board may be an electronic controlling board that is capable of receiving an electronic signal (such as a voltage signal) from the temperature sensor and produces a resultant electronic signal (such as a voltage signal). The controlling board may be a programmable controlling board. The programmable controlling board may be a programmed Arduino controlling board.

The controlling board may be coupled to a cooling means responsive to the resultant electronic signal generated by the controlling board, where in operation, the cooling means cools said light source. The controlling board may be electrically connected to the cooling means. The resultant electronic signal may be a voltage signal generated by a signal transmitter (such as a signal pin) in electronic communication with an electronic switch (such as a transistor). The resultant electronic signal may be generated by a G-mode command according to a circuit description. The electronic switch then activates or stops the flow of a current through the cooling means to thereby activate or stop the operation of the cooling means. The cooling means may be an electronic fan.

Exemplary, non-limiting embodiments of an additive manufacturing system will now be disclosed The present disclosure relates to an additive manufacturing system for three-dimensional printing comprising a lighting system as defined herein.

The additive manufacturing system may further comprise a motion control system for finely tuning resolution of moving on the z-axis direction. The resolution of moving on the z-axis direction may be in the range of about 10 μm to about 100 μm, about 10 μm to about 90 μm, about 10 μm to about 80 μm, about 10 μm to about 70 μm, about 10 μm to about 60 μm, about 10 μm to about 50 μm, about 10 μm to about 40 μm, about 10 μm to about 30 μm, about 10 μm to about 20 μm, about 20 μm to about 100 μm, about 30 μm to about 100 μm, about 40 μm to about 100 μm, about 50 μm to about 100 μm, about 60 μm to about 100 μm, about 70 μm to about 100 μm, about 80 μm to about 100 μm, or about 90 μm to about 100 μm.

The motion control system may comprise a linear guide with step motor. The motion control system may further comprise a motor control board.

The additive manufacturing system may further comprise a display system for projecting slicing layer images on the x/y plane for high resolution printing. The resolution on the x/y plane may be in the range of about 20 μm to about 200 μm, about 30 μm to about 200 μm, about 40 μm to about 200 μm, about 50 μm to about 200 μm, about 60 μm to about 200 μm, about 80 μm to about 200 μm, about 100 μm to about 200 μm, about 120 μm to about 200 μm, about 140 μm to about 200 μm, about 160 μm to about 200 μm, about 180 μm to about 200 μm, about 20 μm to about 180 μm, about 20 μm to about 160 μm, about 20 μm to about 140 μm, about 20 μm to about 120 μm, about 20 μm to about 100 μm, about 20 μm to about 80 μm, about 20 μm to about 60 μm, about 20 μm to about 50 μm, about 20 μm to about 40 μm, about 20 μm to about 30 μm, or about 20 μm to about 50 μm. The resolution on the x/y plane may be about 50 μm. The resolution on the x/y plane may be about 20 μm.

The display system may be a Liquid Crystal Display (LCD) display system.

The additive manufacturing system may comprise an end-stop switch coupled to the motor control board of the motion control system for protecting the display from wrong operation which may cause harmful effects to the printer. The end-stop switch may be connected to the motor control board of the motion control system.

Advantageously, the additive manufacturing system may operate with a high light intensity of the lighting system to reduce the curing time of each slicing layer during three-dimensional printing, and therefore achieve a fast printing speed.

The additive manufacturing system may be used for vat polymerization based resins such as acrylates and epoxy.

It is to be appreciated that any acrylate that is suitable for three-dimensional printing can be used here. Exemplarily, the acrylate may be a monomer or oligomer selected from the group consisting of methyl methacrylate, bisphenol A dimethacrylate (Bis-DMA), bisphenol A diglycidyl ether methacrylate (Bis-GMA), ethoxylated bisphenol-A dimethacrylate (Bis-EMA), Tricyclo[5.2.1.02,6]decanedimethanol diacrylate, Bisphenol A glycerolate diacrylate, Bisphenol A ethoxylate diacrylate, Bisphenol A ethoxylate dimethacrylate (oligo), Bisphenol F ethoxylate diacrylate (oligo), Poly (ethylene glycol) diacrylate, Di(ethylene glycol) diacrylate, Tetra(ethylene glycol) diacrylate, 1,4-Butanediol diacrylate, Hydroxy ethylmethacrylate, 3,4-epoxy-cyclohexyl-methyl methacrylate (METHB), triethylene glycol dimethacrylate (TEGDMA), Tertiobutyl cyclohexanol methacrylate, 1,6-bis [2-(methacryloyloxy) ethoxycarbonylamino]-2,4,4-trimethylhexane (UDMA), 3,3,5-trimethyl cyclohexanol methacrylate, fipentaerythritol penta-hexa-acrylate, ethylene glycol diglycidyl ether, 1,4-butanediol diglycidyl ether, resorcinol diglycidyl ether, diglycidyl 1,2-cyclohexanedicarboxylate, propylene glycol diglycidyl ether and neopentyl glycol diglycidyl ether and mixtures thereof. The resin may be poly(methyl methacrylate) (PMMA).

The printing speed may be in the range of about 2 seconds per layer to about 4 seconds per layer, about 2.5 seconds per layer to about 4 seconds per layer, about 3 seconds per layer to about 4 seconds per layer, about 3.5 seconds per layer to about 4 seconds per layer, about 2 seconds per layer to about 3.5 seconds per layer, about 2 seconds per layer to about 5 seconds per layer, or about 2 seconds per layer to about 2.5 seconds per layer. The printing speed may be 3 seconds per layer.

Advantageously, structure arrangement has been optimized to minimize the size of the additive manufacturing system. Space optimization ensures an additive manufacturing system that is tightly packed but with good heat dissipation. Interface optimization between the motion control system and display system ensures high-speed printing. Due to the high efficiency and stability of the lighting system, the printing speed of the present disclosure may be 2 to 3 times faster than the commercial additive manufacturing systems.

Further advantageously, the additive manufacturing system may achieve a steady printing performance with high resolution due to the cooling system with temperature sensing and responding capability. This solves the problem of unstable performance due to heat accumulation for high power lighting sources. Articles with fine and complicated structures can be printed with the additive manufacturing system as described herein.

The additive manufacturing system can be used to manufacture various healthcare products with fast printing speed and high resolution.

The present disclosure further relates to a method of assembling the additive manufacturing system as described herein.

EXAMPLES

Non-limiting examples of the invention will be further described in greater detail by reference to specific Examples, which should not be construed as in any way limiting the scope of the invention.

Example 1: Assembly of the Lighting System with Self-Feedback Cooling System

Figure 1:
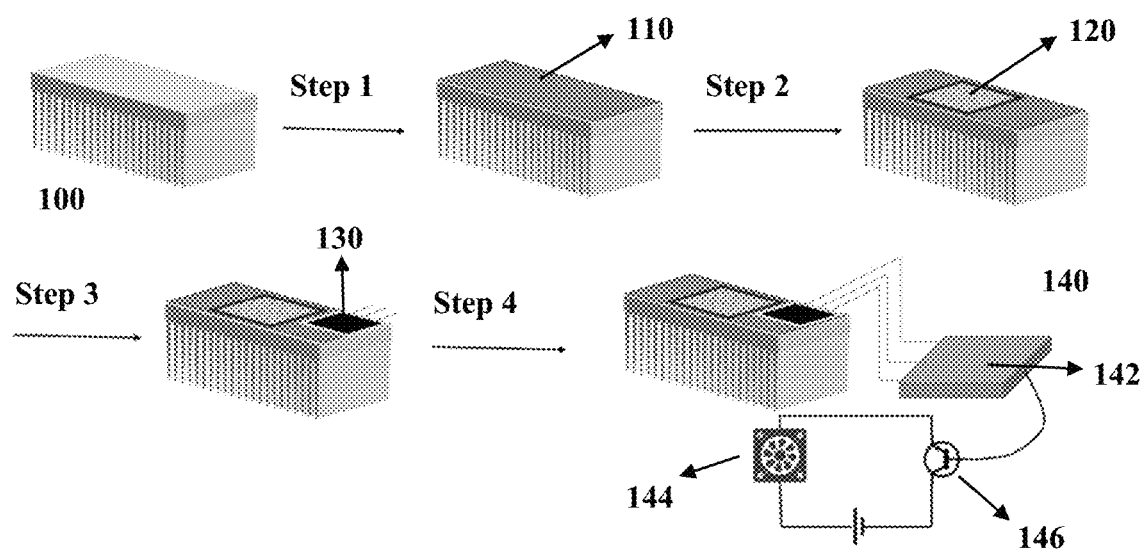
FIG. 1 is a schematic diagram showing building of the self-feedback cooling system for a LED lighting source.

To build the lighting system with self-feedback cooling system, several cooling technologies were integrated. The assembly of the lighting system with self-feedback cooling system is shown in FIG. 1. There was provided a heat sink 100. In Step 1, a thermally conductive adhesive 110 was coated onto the heat sink 100. In Step 2, a light source (such as a LED array) 120 was attached onto the thermally conductive adhesive 110. The heat sink can be used to quickly dissipate the heat generated from the LED array. Without the thermally conductive adhesive, air gap between the heat sink and the LED array may seriously affect heat conducting and the efficiency of heat dissipation because the high heat insulting property of air. Therefore, the thermally conductive adhesive was applied to fill the gap between the LED array and the heat sink.

In Step 3, a temperature sensor 130 was attached onto the thermally conductive adhesive 110. The temperature sensor can be a LM35 temperature sensor. In step 4, a cooling system 140 was built, which includes the temperature sensor 130, a controlling board 142 and a cooling means 144. The controlling board can be electronic controlling board. The cooling means can be an electronic fan. The cooling system 140 with temperature monitoring and self-feedback system as designed can provide a constant temperature for the light source 120.

In detail, the temperature sensor 130 can export a voltage signal to the controlling board 142. The controlling board can be a programmed Arduino controlling board. In the controlling board, a signal transmitter (such as a signal pin) was created and applied to an electronic switch (such as a transistor) 146. The signal pin can be applied to the base terminal of the transistor. Then a voltage signal was created by the transistor according to a circuit description defined by a G-code command. The cooling means 144 (such as an electric fan) operates at a default cooling rate when the light source 120 is turned on. If the temperature of the light source is higher than a set temperature (such as 25° C.), the controlling board will generate a 10% increase of the duty cycle for one more degree Celsius temperature increase of the light source. As a result, the fan will spin at a speed 10% faster for each degree Celsius temperature increase of the light source. If the temperature is lower than the set temperature (such as room temperature at 25° C.), the fan will stop or operate at the default cooling rate.

Figure 2:
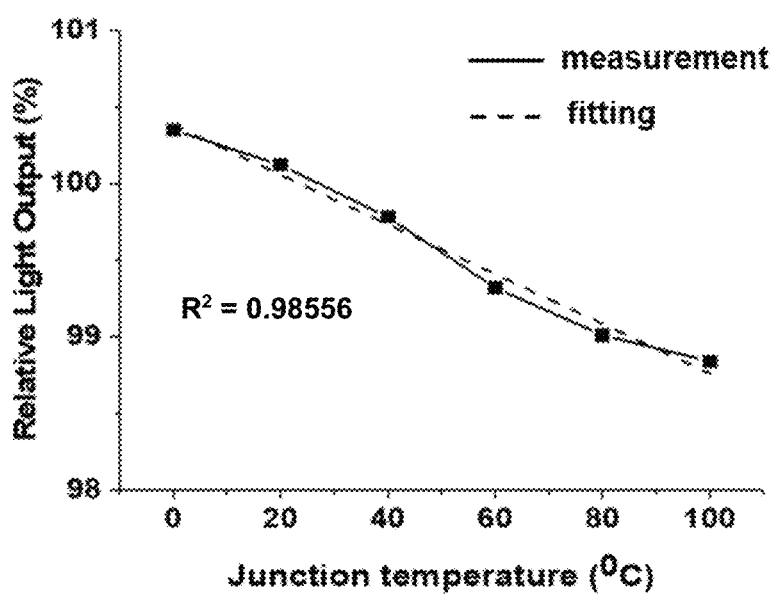
FIG. 2 is a graph showing the relationship between junction temperature and conversion efficiency of a LED light source.

FIG. 2 shows the relationship between junction temperature and conversion efficiency of a LED light source 405 nm, 100 W. Light efficiency was measured by the Compact Power and Energy Meter Console with Standard Photodiode Power Sensor (Silicon, 200-1100 nm). The conversion efficiency as indicated by the relative light output decreased with the increase of the junction temperature. The solid line is the measurement data and the dash line is the fitting line. The set temperature range of 20° C. to 40° C. was optimized based on the light source to achieve a high conversion efficiency of about 100%. The fitting mean square error $R^2$ indicates that there was a close match between actual values and the predicted/estimated values.

Example 2: Assembly of the Three-Dimensional Printer Prototype

Assembly of the three-dimensional printer prototype may include the following 11 steps:

Step 1. Frame Work Setting up

Figure 3:
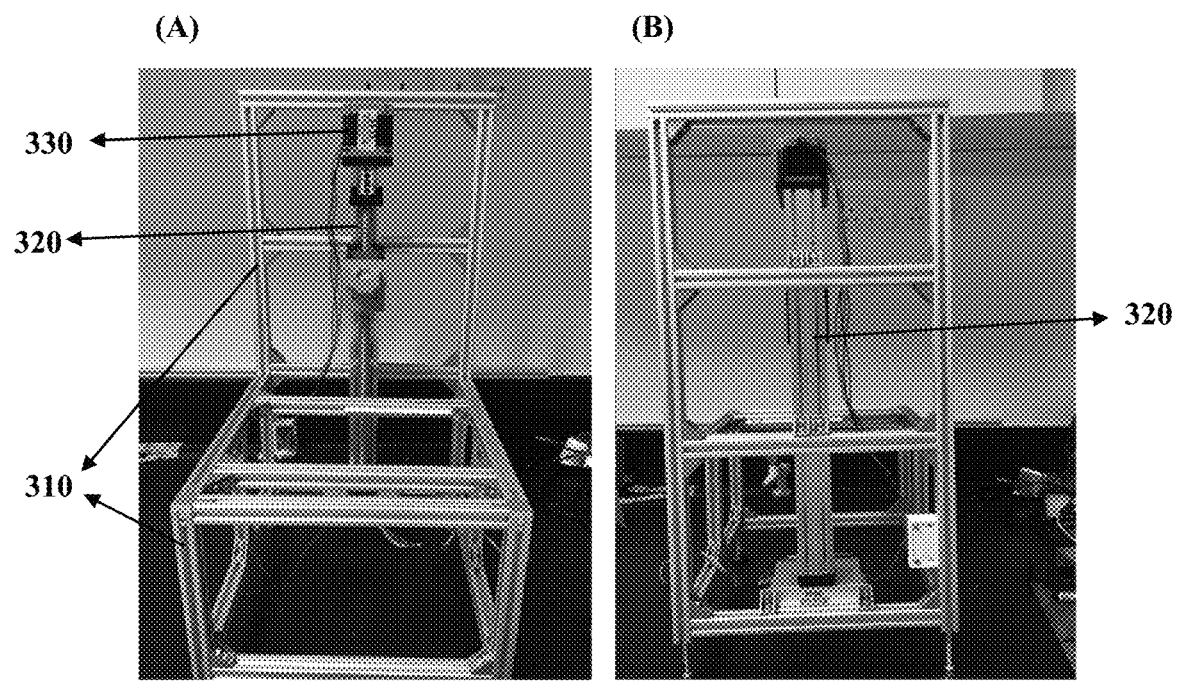
FIG. 3 is a photo showing (A) the front side and (B) the back side images of the printer after fixing the ball screws.

As shown in FIG. 3, aluminium profile 2020 was used to build a main frame work 310 of the three-dimensional printer. The front of the frame work was 310 mm. The depth of the frame work was 370 mm. The height of the frame work was 570 mm. The width of the frame work was 310 mm.

Step 2. Fixing the Ball Screw Component (with Step Motor) to the Frame Work

A linear guide 320 with a step motor 330 was fixed to the back side of the frame work using nails and screws. The linear guide can be a FUYU FLS linear guide. The step motor was set at the bottom of the linear guide as can be seen in FIG. 3.

FIG. 3A shows the front side image of the three-dimensional printer after fixing the ball screws and FIG. 3B shows the back side image of the three-dimensional printer after fixing the ball screws.

Step 3. Connecting the Step Motor to the Control Board

The step motor 330 was connected to an Arduino plate as control panel 630, which was used to control the z-axis moving of the step motor during printing.

Step 4. Building the LED Holder

Figure 4:
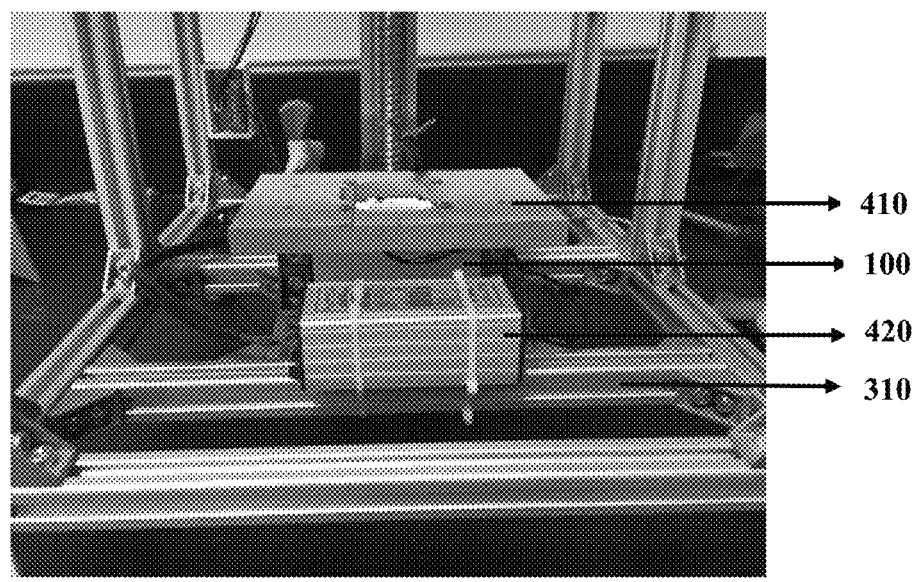
FIG. 4 is a photo showing the building of the LED lighting source in a LED holder.

As shown in FIG. 4, A LED holder 410 was built based on the dimension of the LED array, the cooling system and the frame work, by using aluminium profile and a wood plate. After that, the LED holder was fixed to the bottom of the frame work.

Step 5. Connecting the LED Array to LED Driver

The LED array was attached to the heat sink 100 with a layer of the thermally conductive adhesive, together with the self-feedback cooling system. Then the LED array was connected to a LED driver built together to the control panel 630. These items were fixed to the printer frame work as shown in FIG. 4.

Step 6. Building the Printer Power Supply

A 24-V DC power supply 420 was fixed to the frame work and the output of the power supplier was connected to the motor and the LED array separately.

Step 7. Building a LED Cover

Two pieces of aluminium plates were used to fold and build a LED cover for LED light protection and reflection. The built LED cover was fixed on the LED holder, with the bottom attached to the LED array and the top directly connected to a LCD holder.

Step 8. Building the LCD Holder

Figure 5:
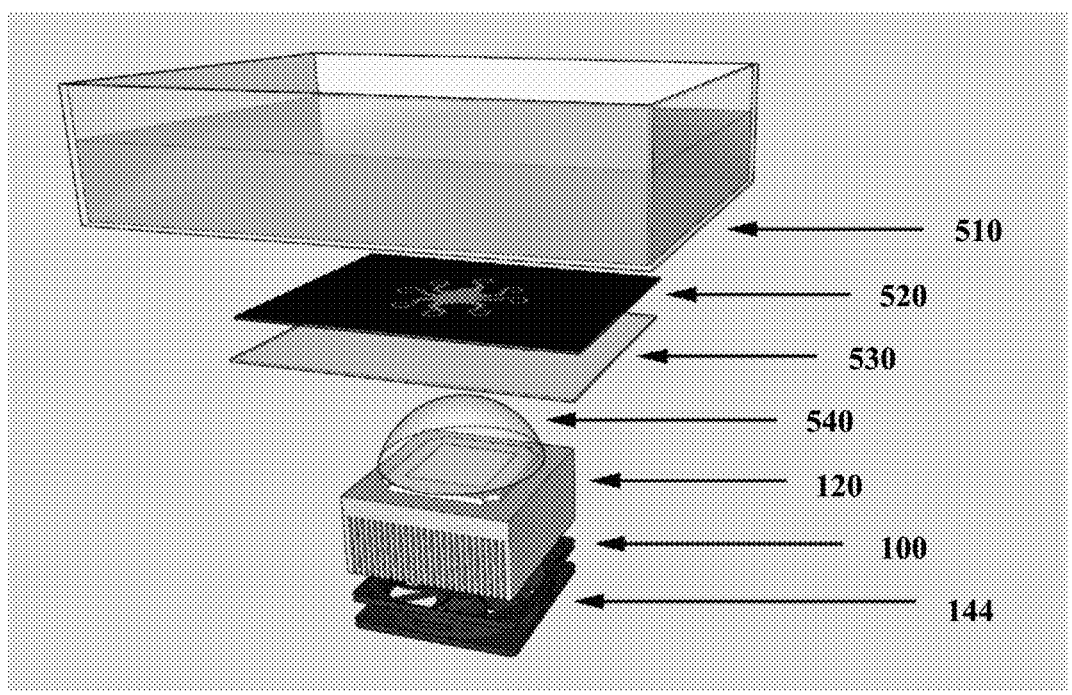
FIG. 5 is a schematic diagram in an exploded view showing the arrangement of some components of the three-dimensional printer.

A schematic diagram is shown in FIG. 5 to illustrate some of the components of the three-dimensional printer. A condense lens 540 was placed on top of the high power LED array 120 to diverge the light from the LED array. Another lens (such as a Fresnel lens) 530 was used in between the condenser lens 540 and a LCD screen 520 for further directing the light from the LED array. A printing tray (vat) 510 was placed on top of the LCD screen 520 for holding the polymer solution for three-dimensional printing.

Figure 6:
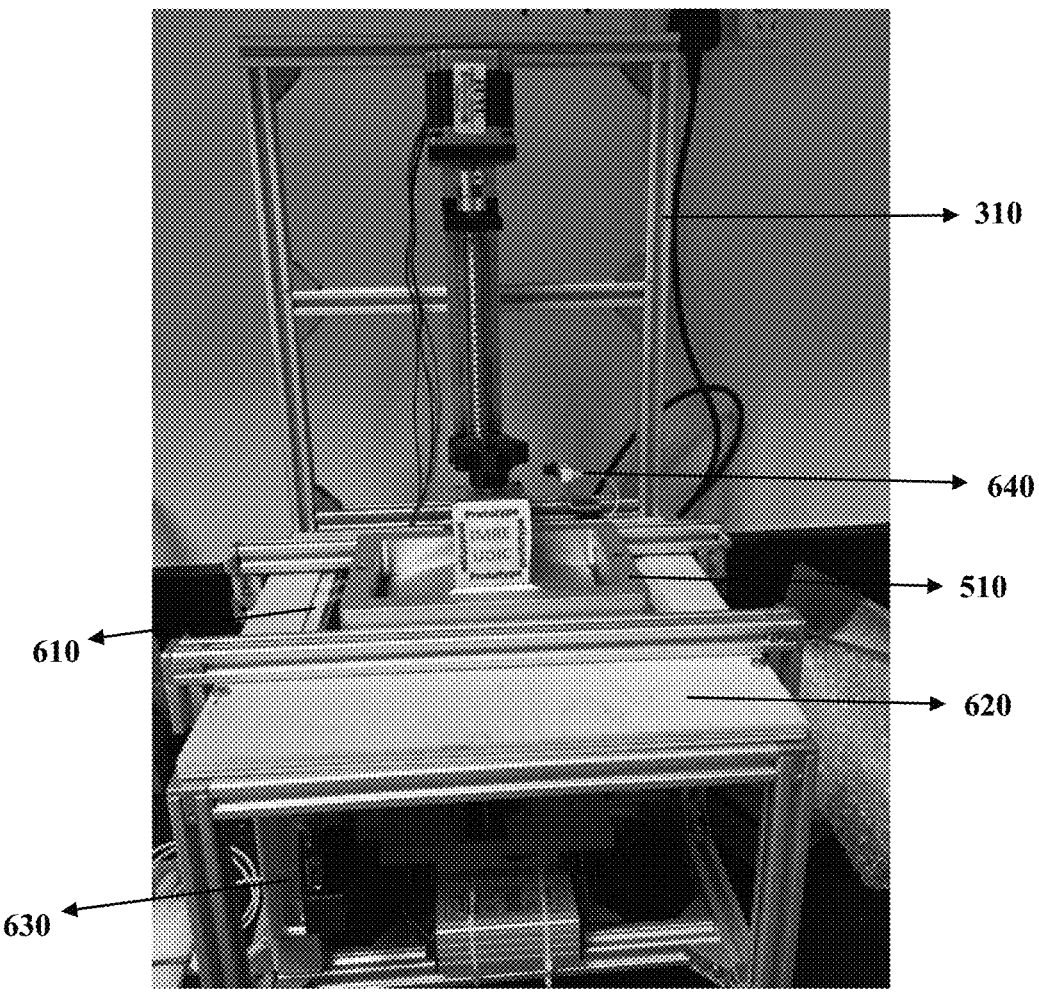
FIG. 6 is a photo showing the built prototype of the three-dimensional printer.
Figure 7:
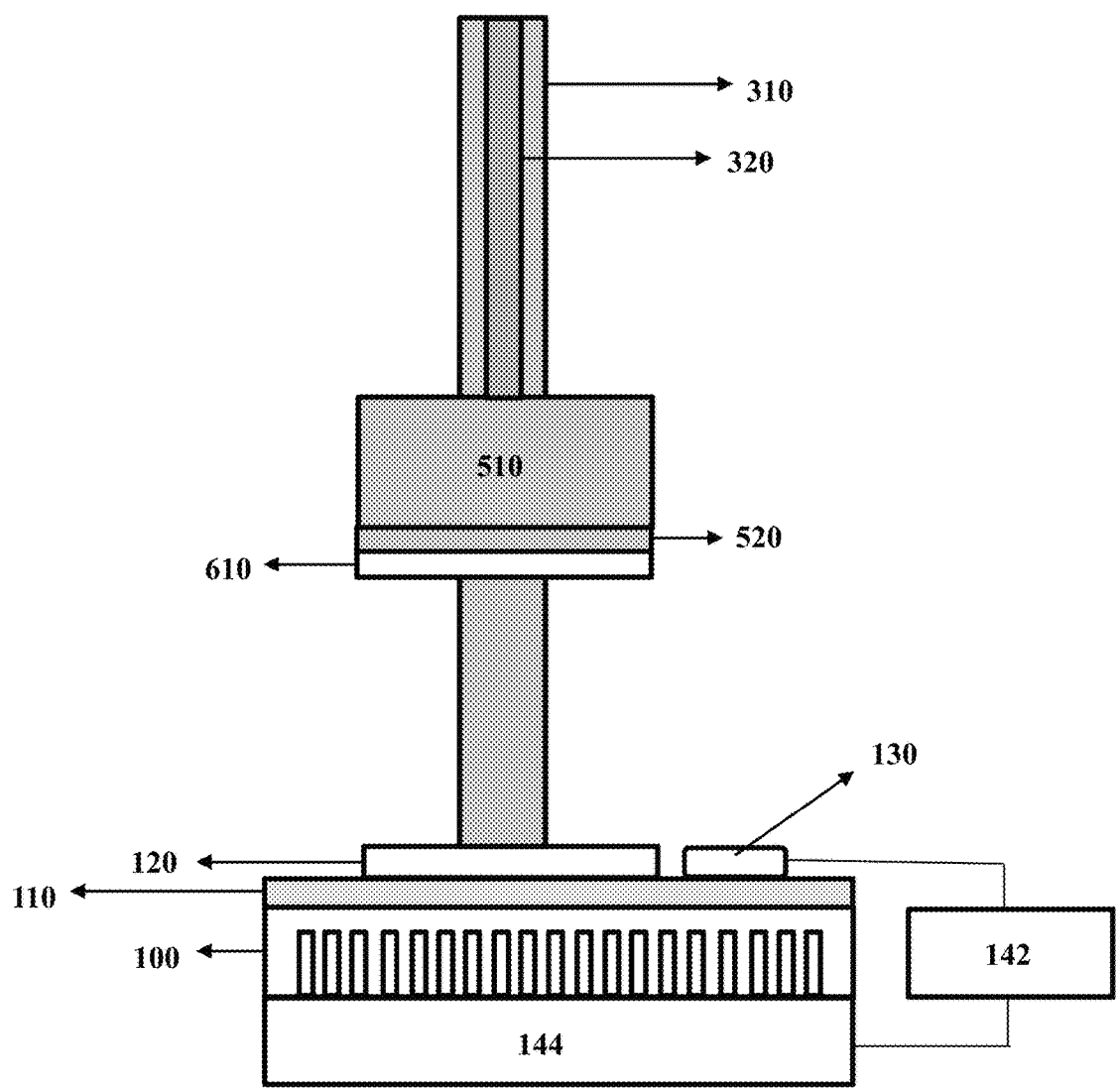
FIG. 7 is a schematic diagram in a front-view of some components of the three-dimensional printer.

FIG. 6 shows a photo of a built prototype of the three-dimensional printer and FIG. 7 shows a schematic diagram in a front-view of some of the components of the three-dimensional printer.

One transparent PMMA plate 610 was cut with a size similar to the dimension of a LCD screen 520. Then, one wood plate 620 was cut, which can hold the cut PMMA plate 610. The wood plate 620 was fixed to the main frame work 310 at a distance of several centimetres from the LED array.

Step 9. Setting up the LCD Screen

The LCD screen 520 was placed on the transparent holding PMMA plate 610, which was then placed in a target position. The LCD screen 520 was then connected to its controller.

Step 10. Setting up the Printing Tray and Platform

A printing tray 510 was fixed on top of the LCD screen 520 and a printing platform was built onto a gliding block. To protect LCD screen 520 from the wrong operation, an end-stop switch 640 was connected to its motor control board.

Step 11. Checking the Power Supply and Connectors

It was checked if all the driver are correctly connected to the power supply and if the LED array 120, the LCD screen 520 and the motors were correctly connected to their corresponding drivers/controllers.

Step 12. Connecting to a Control Computer (1) A LCD controller board was connected to a computer with the printing software through HDMI cable.

(2) The motor controller (the Arduino board) was connected to the computer through USB cable or bluetooth serial module.

(3) Micromake software was opened and a configuration file was imported.

Step 13. Testing (1) One printing demo STL file was loaded to the computer.

(2) Slicing was performed on the computer and an order was sent to the printer.

(3) A printing test was performed.

For the three-dimensional printer prototype as built above, the temperature of the LED array is monitored by the temperature sensor which controls the speed of the electronic fan through an electronics platform with the self-feedback cooling system. In this way, a high power of light source can be used in the system with steady performance. Combining with the high resolution of the LCD display and fast motor system, a LCD-display based printing process and a printer prototype are provided with high printing resolution and faster printing speed. The built prototype shows a resolution of 2560×1600 pixel, with a printing speed of 3 second/layer for normal resin by using a 50-watt LED light source.

INDUSTRIAL APPLICABILITY

The disclosed lighting system and methods may be used in an additive manufacturing system for maintaining the stability of the light source at a high power. Therefore, the additive manufacturing system can be used to manufacture various products with fast printing speed and high resolution, which are applicable for a wide range of industrial sectors, such as healthcare industry.

It will be apparent that various other modifications and adaptations of the invention will be apparent to the person skilled in the art after reading the foregoing disclosure without departing from the spirit and scope of the invention and it is intended that all such modifications and adaptations come within the scope of the appended claims.

The invention claimed is:

1. A lighting system comprising
a light source, and
a cooling system with temperature sensing and responding capability coupled to the light source for maintaining a temperature of the light source within a defined variation from a set temperature, and programmed to increase its operation by a defined percentage for each degree Celsius temperature increase of the light source when the temperature of the light source is above the defined variation.

2. The light system of claim 1, wherein the light source is a light emitting diode (LED) array.

3. The light system of claim 1, wherein a power rating of the light source is in a range of about 30 watt to about 80 watt.

4. The light system of claim 1, further comprising a heat sink coupled to the light source.

5. The light system of claim 4, further comprising a thermally conductive adhesive which fills a gap between the light source and the heat sink.

6. The light system of claim 4, wherein the light source and the temperature sensor are disposed on the heat sink and the temperature sensor detects the temperature of the heat sink.

7. The light system of claim 1, wherein the cooling system comprises:
a temperature sensor;
a controlling board configured to generate a command signal responsive to the temperature sensor; and
a cooling means configured to cool the light source in response to the command signal.

8. The light system of claim 7, wherein the temperature sensor is coupled to the light source.

9. The light system of claim 7, wherein the cooling means is an electronic fan.

10. An additive manufacturing system for three-dimensional printing comprising the lighting system of claim 1.

11. A method of adjusting a temperature of a light source comprising the steps of
   a) sensing the temperature of the light source, and
   b) adjusting an operation of a cooling means of a cooling system with the temperature sensing and responding capability coupled to the light source in response to a temperature change of the light source, whereby the temperature change is a temperature difference between the temperature sensed in step (a) and a set temperature of the light source, wherein the adjusting comprises the steps of
   b1) operating the cooling means at a default cooling rate when the light source is turned on, and
   b2) increasing the operation of the cooling means by a defined percentage for each degree Celsius temperature increase of the light source above the set temperature.

12. The method of claim 11, wherein the set temperature is in a range of about 20° C. to about 40° C.

13. The method of claim 11, wherein the defined percentage is in a range of about 5% to about 30%.

14. The method of claim 11, wherein step b) further comprises a step of operating the cooling means at the default cooling rate or stopping the cooling means if the temperature of the light source is lower than the set temperature.

15. The method of claim 11, wherein the default cooling rate is in a range about 50 rpm to about 200 rpm.

16. A method of assembling a lighting system, comprising the steps of
   a) attaching a light source to a heat sink with a thermally conductive adhesive, and
   b) coupling a cooling system with temperature sensing and responding capability to the light source, the heat sink, or the thermally conductive adhesive,
   wherein the lighting system comprises the light source, and the cooling system with temperature sensing and responding capability coupled to the light source for maintaining a temperature of the light source within a defined variation from a set temperature and programmed to increase its operation by a defined percentage for each degree Celsius temperature increase of the light source when the temperature of the light source is above the defined variation.

17. The method of claim 16, wherein the cooling system is coupled to the light source, the heat sink, or the thermally conductive adhesive via a temperature sensor.

18. The method of claim 17, wherein the temperature sensor is further coupled to a controlling board and the controlling board is coupled to a cooling means responsive to a command signal generated by the controlling board.

* * * * *

UNITED STATES PATENT AND TRADEMARK OFFICE
CERTIFICATE OF CORRECTION

PATENT NO. : 12,262,505 B2
APPLICATION NO. : 17/912543
DATED : March 25, 2025
INVENTOR(S) : Fuke Wang Page 1 of 1

It is certified that error appears in the above-identified patent and that said Letters Patent is hereby corrected as shown below:

In the Claims

At Column 14, Line 5, "range about" should be -- range of about --.

Signed and Sealed this
Seventh Day of October, 2025

John A. Squires
*Director of the United States Patent and Trademark Office*